US 7,327,184 B2

(12) United States Patent
Sung et al.

(10) Patent No.: US 7,327,184 B2
(45) Date of Patent: Feb. 5, 2008

(54) LOW-POWER MULTI-LEVEL PULSE AMPLITUDE MODULATION DRIVER AND SEMICONDUCTOR DEVICE HAVING THE DRIVER

(75) Inventors: Ki-Hyuk Sung, Suwon-si (KR); Chi-Won Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 22 days.

(21) Appl. No.: 11/454,746

(22) Filed: Jun. 16, 2006

(65) Prior Publication Data

US 2007/0052455 A1    Mar. 8, 2007

(30) Foreign Application Priority Data

Sep. 6, 2005    (KR)    .................. 10-2005-0082495

(51) Int. Cl.
*G06F 7/44* (2006.01)
(52) U.S. Cl. .................. 327/359; 327/51; 327/52; 327/65; 330/254; 332/149; 332/152; 377/353
(58) Field of Classification Search .................. None
See application file for complete search history.

(56) References Cited

U.S. PATENT DOCUMENTS

| | | | | |
|---|---|---|---|---|
| 4,795,923 A | * | 1/1989 | Dobos | 327/280 |
| 4,866,314 A | * | 9/1989 | Traa | 327/278 |
| 5,969,579 A | * | 10/1999 | Hartke et al. | 332/116 |
| 6,163,215 A | * | 12/2000 | Shibata et al. | 330/254 |
| 7,193,467 B2 | * | 3/2007 | Garlepp et al. | 330/259 |
| 7,205,796 B2 | * | 4/2007 | Kawano | 326/115 |
| 2003/0202671 A1 | * | 10/2003 | Pauser | 381/150 |
| 2004/0232945 A1 | | 11/2004 | Tseng | 326/68 |
| 2005/0069067 A1 | | 3/2005 | Zerbe et al. | 375/353 |
| 2005/0218986 A1 | * | 10/2005 | Garlepp et al. | 330/259 |

FOREIGN PATENT DOCUMENTS

| | | |
|---|---|---|
| JP | 08-070223 | 3/1996 |
| JP | 10-177438 | 6/1998 |

* cited by examiner

OTHER PUBLICATIONS

English Abstract for Japanese Publication No. 08-070223, Mar. 12, 1998.

*Primary Examiner*—Tuan T. Lam
*Assistant Examiner*—Hiep Nguyen
(74) *Attorney, Agent, or Firm*—F. Chau & Associates, LLC

(57) ABSTRACT

A low-power multi-level pulse amplitude modulation (PAM) driver, and a semiconductor device having the same, in which the multi (M)-level PAM driver includes a load unit, first and second current sources, a pair of first input transistors, a pair of second input transistors, and a current source controller, where M is an integer greater than 3. The load unit is electrically connected to an output terminal, and the first and second current sources respectively supply a first amount of current and a second amount of current to the load unit. The pair of first input transistors electrically connects the first current source and the load unit in response to a first bit signal, and the pair of the second input transistors electrically connects the second current source and the load unit in response to a second bit signal. The current source controller activates or deactivates one of the first and second current sources in response to the first and second bit signals. Accordingly, current sources for a multi-level PAM driver are selectively activated or deactivated, thereby minimizing power consumption in the multi-level PAM driver.

13 Claims, 7 Drawing Sheets

FIG. 3(PRIOR ART)

| B1 | B2 | DIFFERENTIAL OUTPUT VOLTAGE |
|---|---|---|
| Low | Low | −3RI |
| Low | High | RI |
| High | Low | −RI |
| High | High | 3RI |

FIG. 5

| B1 | B2 | DIFFERENTIAL OUTPUT VOLTAGE |
|---|---|---|
| Low | Low | −3RI |
| Low | High | −RI |
| High | Low | RI |
| High | High | 3RI |

LOW-POWER MULTI-LEVEL PULSE AMPLITUDE MODULATION DRIVER AND SEMICONDUCTOR DEVICE HAVING THE DRIVER

CROSS-REFERENCE TO RELATED PATENT APPLICATIONS

This application claims priority to Korean Patent Application No. 2005-82495, filed on Sep. 6, 2005, in the Korean Intellectual Property Office, the disclosure of which is incorporated by reference herein.

BACKGROUND OF THE INVENTION

1. Technical Field

The present invention relates to data transmission, and more particularly, to a multi-level pulse amplitude modulation (PAM) signal driver.

2. Discussion of the Related Art

Multi-level signaling has been introduced to increase the amount of information exchanged, without increasing the speed of data transmission. A 4-PAM (Pulse Amplitude Modulation) driver transmits twice as much information as a 2-PAM driver operating at the same speed. However, in order to satisfy bit error rate requirements, the 4-PAM driver requires more power than the 2-PAM driver.

FIG. 1 is a circuit diagram illustrating a conventional 2-PAM driver. Referring to FIG. 1, the conventional 2-PAM driver includes a first input transistor NT1, a second input transistor NT2, a current source 110, a first resistor R1, and a second resistor R2. A bit signal B1 and an inversion signal /B1 of the bit signal B1 are applied to gates of the first and second input transistors NT1 and NT2, respectively.

When the bit signal B1 is high, a differential output voltage Out+–Out– is RI, and when the bit signal B1 is low, the differential output voltage Out+–Out– is –RI. The differential output voltage Out+–Out– is the difference between a positive output voltage Out+ and a negative output voltage Out–. Since current I always flows through the conventional 2-PAM driver of FIG. 1, power used by the 2-PAM driver is VDD×I.

FIG. 2 is a circuit diagram illustrating a conventional 4-PAM driver. Compared to the conventional 2-PAM driver of FIG. 1, the 4-PAM driver further includes a second current source 220, a third input transistor NT3, and a fourth input transistor NT4.

A first bit signal B1 and an inversion signal /B1 of the bit signal B1 are applied to gates of the first and second input transistors NT1 and NT2, respectively. A second bit signal B2 and an inversion signal /B2 of the bit signal B2 are applied to gates of the third and fourth input transistors NT3 and NT4, respectively. A differential output voltage Out+–Out– between the first and second bit signals B1 and B2 is illustrated in FIG. 3.

Referring to FIG. 3, the differential output voltage Out+–Out– is –3RI when both the first and second bit signals B1 and B2 are low. The differential output voltage Out+–Out– is RI when the first bit signal B1 is low and the second bit signal B2 is high. The differential output voltage Out+–Out– is –RI when the first bit signal B1 is high and the second bit signal B2 is low. The differential output voltage Out+–Out– is 3RI when both the first and second bit signals B1 and B2 are high.

The conventional 4-PAM driver transmits the differential output voltages RI, –RI, 3RI, or –3RI corresponding to the states of the first and second bit signals B1 and B2, thereby transmitting information contained in the first and second bit signals B1 and B2. However, as illustrated in FIG. 2, in the conventional 4-PAM driver, both the first and second current sources 210 and 220 are kept active. Therefore, the amount of power used by the conventional 4-PAM driver shown in FIG. 2 is 3VDD×I.

Since a 4-PAM driver requires more power than a 2-PAM driver, much research has been conducted to develop a 4-PAM driver that requires less power to transmit information.

SUMMARY OF THE INVENTION

According to an exemplary embodiment of the present invention, there is provided an M-level pulse amplitude modulation (PAM) driver comprising a load unit, first and second current sources, a pair of first input transistors, a pair of second input transistors, and a current source controller, where M is an integer greater than 3. The load unit is electrically connected to an output terminal. The first current source supplies a first amount of current to the load unit, and the second current source supplies a second amount of current to the load unit. The pair of first input transistors electrically connects the first current source and the load unit in response to a first bit signal, and the pair of second input transistors electrically connects the second current source and the load unit in response to a second bit signal. The current source controller activates or deactivates one of the first and second current sources in response to the first and second bit signals.

According to an exemplary embodiment of the present invention, there is provided an M-level PAM driver comprising a load unit, a differential output terminal, an input unit, at least two current sources, and a current source controller, where M is an integer greater than 3. The differential output terminal outputs a differential output voltage signal based on the amount of current flowing through the load unit. The input unit receives at least two bit signals. The current sources respectively supply different amounts of current to the load unit. The current source controller activates or deactivates one of the current sources in response to the bit signals.

According to an exemplary embodiment of the present invention, there is provided a semiconductor device comprising a storage unit, and an M-level PAM driver, where M is an integer greater than 3. The M-level PAM driver comprises a load unit, first and second current sources, a pair of first input transistors, a pair of second input transistors, and a current source controller. The load unit electrically connects to an output terminal. The first current source supplies a first amount of current to the load unit, and the second current source supplies a second amount of current to the load unit. The pair of first input transistors electrically connects the first current source and the load unit in response to a first bit signal, and the pair of second input transistors electrically connects the first current source and the load unit in response to a second bit signal. The current source controller activates or deactivates one of the first and second current sources in response to the first and second bit signals. The storage unit stores the first and second bit signals.

BRIEF DESCRIPTION OF THE DRAWINGS

The above and other features of the present invention will become more apparent by describing in detail exemplary embodiments thereof with reference to the attached drawings in which:

FIG. 3 is a table illustrating examples of differential output voltages generated in the 4-PAM driver of FIG. 2;

FIG. 5 is a table illustrating the relationship between an input signal and an output signal in the 4-PAM driver of FIG. 4;

DETAILED DESCRIPTION OF EXEMPLARY EMBODIMENTS

Figure 1:
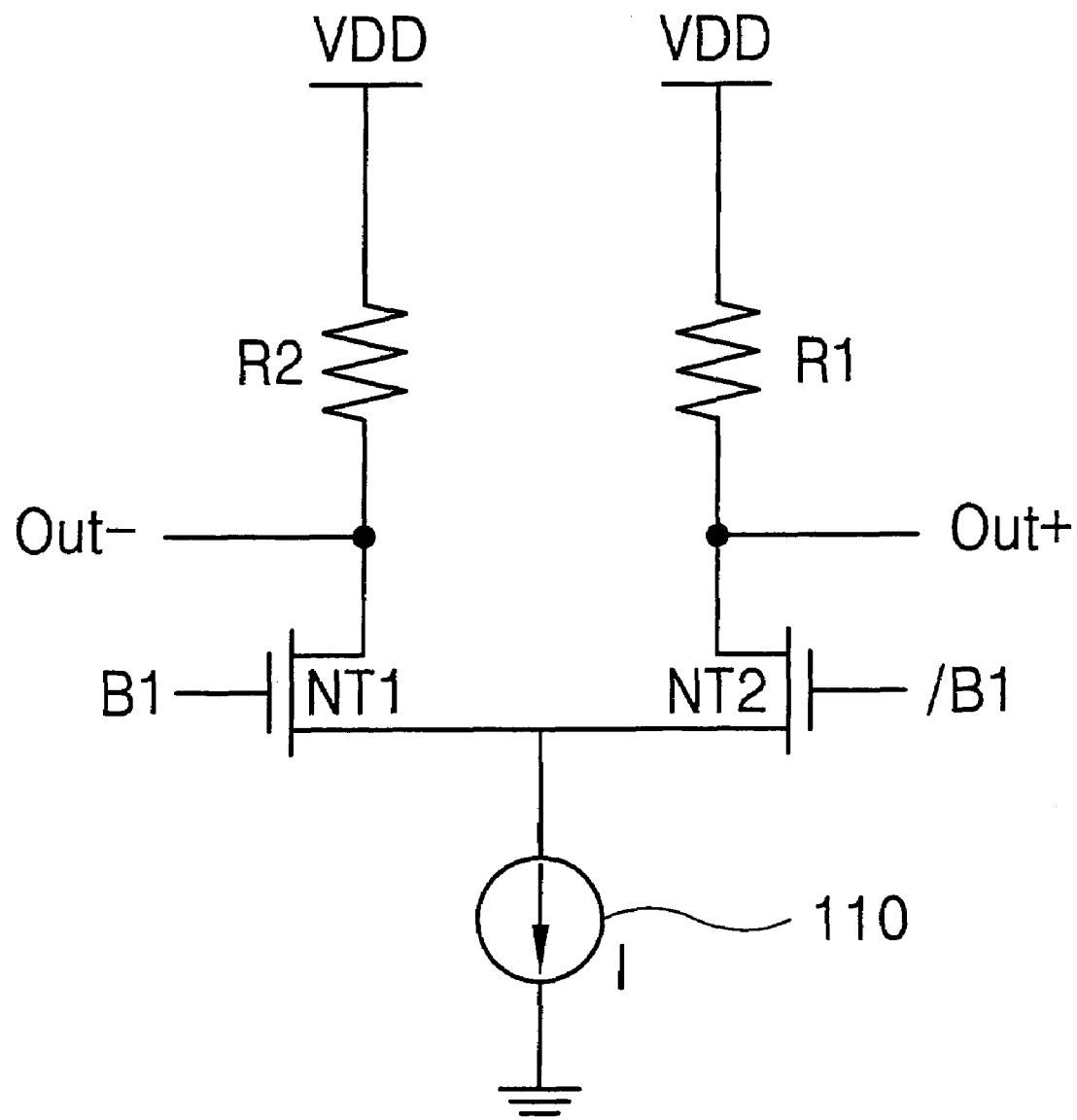
FIG. 1 is a circuit diagram illustrating a conventional 2-PAM (Pulse Amplitude Modulation) driver.
Figure 2:
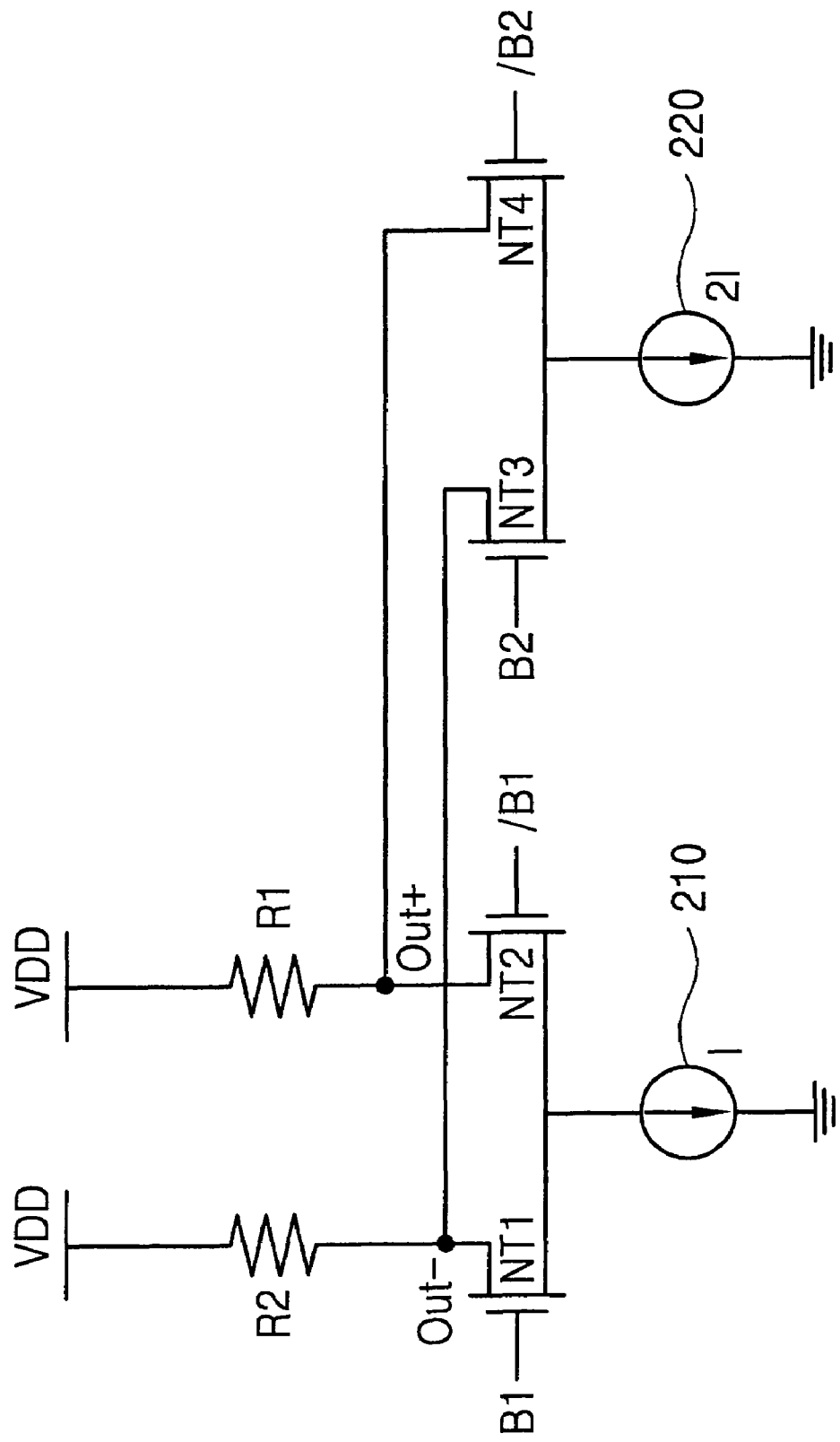
FIG. 2 is a circuit diagram illustrating a conventional 4-PAM driver.

Hereinafter, exemplary embodiments of the present invention will be described in detail with reference to the accompanying drawings. Like reference numerals denote like elements throughout the drawings.

Figure 4:
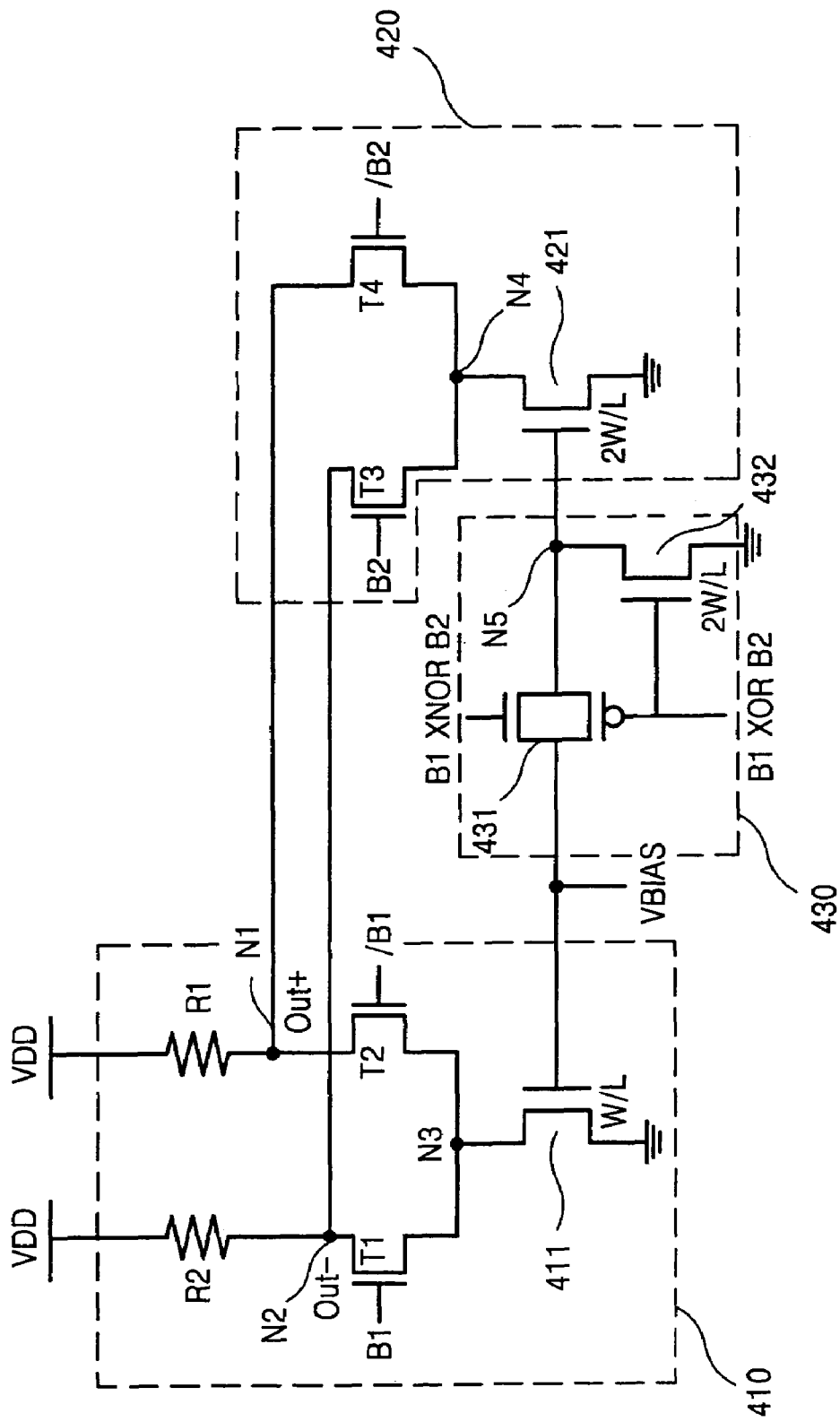
FIG. 4 is a circuit diagram of a low-power 4-PAM driver according to an exemplary embodiment of the present invention.

FIG. 4 is a circuit diagram illustrating a low-power 4-PAM (Pulse Amplitude Modulation) driver according to an exemplary embodiment of the present invention. The 4-PAM driver includes a first-stage circuit 410, a second-stage circuit 420, and a current source controller 430.

The first-stage circuit 410 includes a pair of input transistors T1 and T2, a first load R1, a second load R2, and a first current source 411.

For convenience of explanation, the input transistors T1 and T2 of the first-stage circuit 410 will be referred to as first and second input transistors T1 and T2. The first-stage circuit 410 has a source-coupled structure in which the sources of the first and second input transistors T1 and T2 are connected with each other. The drains of the first and second input transistors T1 and T2 are connected to a negative output terminal N2 and a positive output terminal N1, respectively. The first load R1 is connected between the positive output terminal N1 and a supply voltage source VDD, and the second load R2 is connected between the negative output terminal N2 and the supply voltage source VDD. The first current source 411 is connected between a first source node N3 and a ground voltage node so that current can flow through the second load R2 via the first input transistor T1 or flow through the first load R1 via the second input transistor T2. The amount of current supplied by the first current source 411 is I. The difference between a voltage Out+ of the positive output terminal N1 and a voltage Out− of the negative output terminal N2 is a differential output voltage Out+−Out−.

The first-stage circuit 410 is a differential amplifier type circuit that receives a first bit signal B1 and an inversion signal /B1 of the first bit signal B1 via the first and second input transistors T1 and T2 and generates a differential output voltage.

The second-stage circuit 420 includes a pair of input transistors T3 and T4 and a second current source 421. For convenience of explanation, the input transistors T3 and T4 of the second-stage circuit 420 will be referred to as third and fourth input transistors T3 and T4.

The second-stage circuit 420 also has a source-coupled structure in which the sources of the third and fourth input transistors T3 and T4 are connected with each other. The drains of the third and fourth input transistors T3 and T4 are connected to the negative output terminal N2 and the positive output terminal N1, respectively. The second current source 421 is connected between a second source node N4 and the ground voltage node so that current can flow through the second load R2 via the third input transistor T3 or flow through the first load R1 via the fourth input transistor T4. The amount of current supplied by the second current source 421 is 2I.

The first and second current sources 411 and 421 may be transistors. In an exemplary embodiment of the invention, the ratio of the width to the length of a first transistor, i.e., 2W/L, which is used as the second current source 421, is set to twice the ratio of the width to the length of a second transistor, i.e., W/L, which is used as the first current source 411, so that the amount of current 2I supplied by the second current source 421 is twice the amount of current I supplied by the first current source 411. Transistor width to length ratios are not limited to 2W/L and W/L, as any number of ratios may be suitable. The ratio of transistor width to length ratios is not limited to 2:1, as any number of ratios may be suitable.

The current source controller 430 includes a switch 431 and a control transistor 432.

The switch 431 is activated or deactivated in response to an XOR signal (B1 XOR B2) obtained by performing an XOR operation on the first and second bit signals B1 and B2. In an exemplary embodiment of the invention, the switch 431 is embodied as a transmission gate that is turned on or off in response to the XOR signal (B1 XOR B2), and an XNOR signal (B1 XNOR B2) obtained by performing an XNOR operation on the first and second bit signals B1 and B2.

When the first and second bit signals B1 and B2 are at the same logic level, the switch 431 is closed (switched on) and a bias voltage VBIAS is applied to a gate of the second current source 421, thereby turning on the second current source 421. When the first and second bit signals B1 and B2 are at different logic levels, the switch 431 is opened (switched off) and the bias voltage VBIAS is not applied to the gate of the second current source 421. The bias voltage VBIAS is set such that the first and second current sources 411 and 421 can be activated in response to the bias voltage VBIAS.

The control transistor 432 is activated or deactivated in response to the XOR signal (B1 XOR B2). When the first and second bit signals B1 and B2 are at the same logic level, the control transistor 432 is deactivated. However, when the first and second bit signals B1 and B2 are at different logic levels, the control transistor 432 is activated to apply a ground voltage to the gate of the second current source 421, thereby deactivating the second current source 421.

Accordingly, the current source controller 430 activates the second current source 421 when the first and second bit signals B1 and B2 are at the same logic level, and deactivates the second current source 421 when the first and second bit signals B1 and B2 are at different logic levels. When both the first and second bit signals B1 and B2 are high or low, the second current source 421 is activated. Accordingly, in the present exemplary embodiment, the average amount of current used by the 4-PAM driver is 2VDD×I.

FIG. 5 is a table illustrating the relationship between an input signal and an output signal in the 4-PAM driver of FIG. 4 according to an exemplary embodiment of the present invention. FIG. 5 illustrates levels of a differential output voltage Out+−Out− according to first and second bit signals B1 and B2. The operation of the 4-PAM driver will now be described with reference to FIGS. 4 and 5.

When both the first and second bit signals B1 and B2 are low, the switch 431 of the current source controller 430 is switched on to apply a bias voltage VBIAS to the first and second current sources 411 and 421, thereby activating both the first and second current sources 411 and 421. The first and third input transistors T1 and T3 are deactivated and the second and fourth input transistors T2 and T4 are activated. Current 3I flows through the first load R1 and no current flows through the second load R2. As a result, a voltage Out+ of the positive output terminal N1 is VDD−3RI, a voltage Out− of the negative output terminal N2 is VDD, and thus, a voltage of the differential output voltage Out+−Out− is −3RI.

When the first bit signal B1 is low and the second bit signal B2 is high, the switch 431 of the current source controller 430 is switched off and the control transistor 432 is activated, thereby applying a ground voltage to the second current source 421. Accordingly, the second current source 421 is deactivated. The first and fourth input transistors T1 and T4 are deactivated and the second and third input transistors T2 and T3 are activated. Thus, current I flows through the first load R1 and no current flows through the second load R2. As a result, the voltage Out+ of the positive output terminal N1 is VDD−RI and the voltage Out− of the negative output terminal N2 is VDD. Thus, the voltage of the differential output voltage Out+−Out− is −RI.

When the first bit signal B1 is high and the second bit signal B2 is low, the switch 431 of the current source controller 430 is switched off and the control transistor 432 is activated, thereby applying a ground voltage to the second current source 421. Therefore, the second current source 421 is deactivated. Since the first and fourth input transistors T1 and T4 are activated and the second and third input transistors T2 and T3 are deactivated, no current flows through the first load R1 and current I flows through the second load R2. As a result, the voltage Out+ of the positive output terminal N1 is VDD and the voltage Out− of the negative output voltage N2 is VDD−RI. Thus, the voltage of the differential output voltage Out+−Out− is RI.

When both the first and second bit signals B1 and B2 are high, the switch 431 of the current source controller 430 is switched on to apply the bias voltage VBIAS to the first and second current sources 411 and 421. Thus, both the first and second current sources 411 and 421 are activated. Since the first and third input transistors T1 and T3 are activated and the second and fourth input transistors T2 and T4 are deactivated, no current flows through the first load R1 and current 3I flows through the second load R2. Accordingly, the voltage Out+ of the positive output terminal N1 is VDD and the voltage Out− of the negative output terminal N2 is VDD−3RI Thus, the voltage of the differential output signal Out+−Out− is 3RI.

When the voltage of the differential output voltage Out+−Out− is −RI or RI, the current source controller 430 deactivates the second current source 421, thereby minimizing power consumption in the 4-PAM driver.

Figure 6:
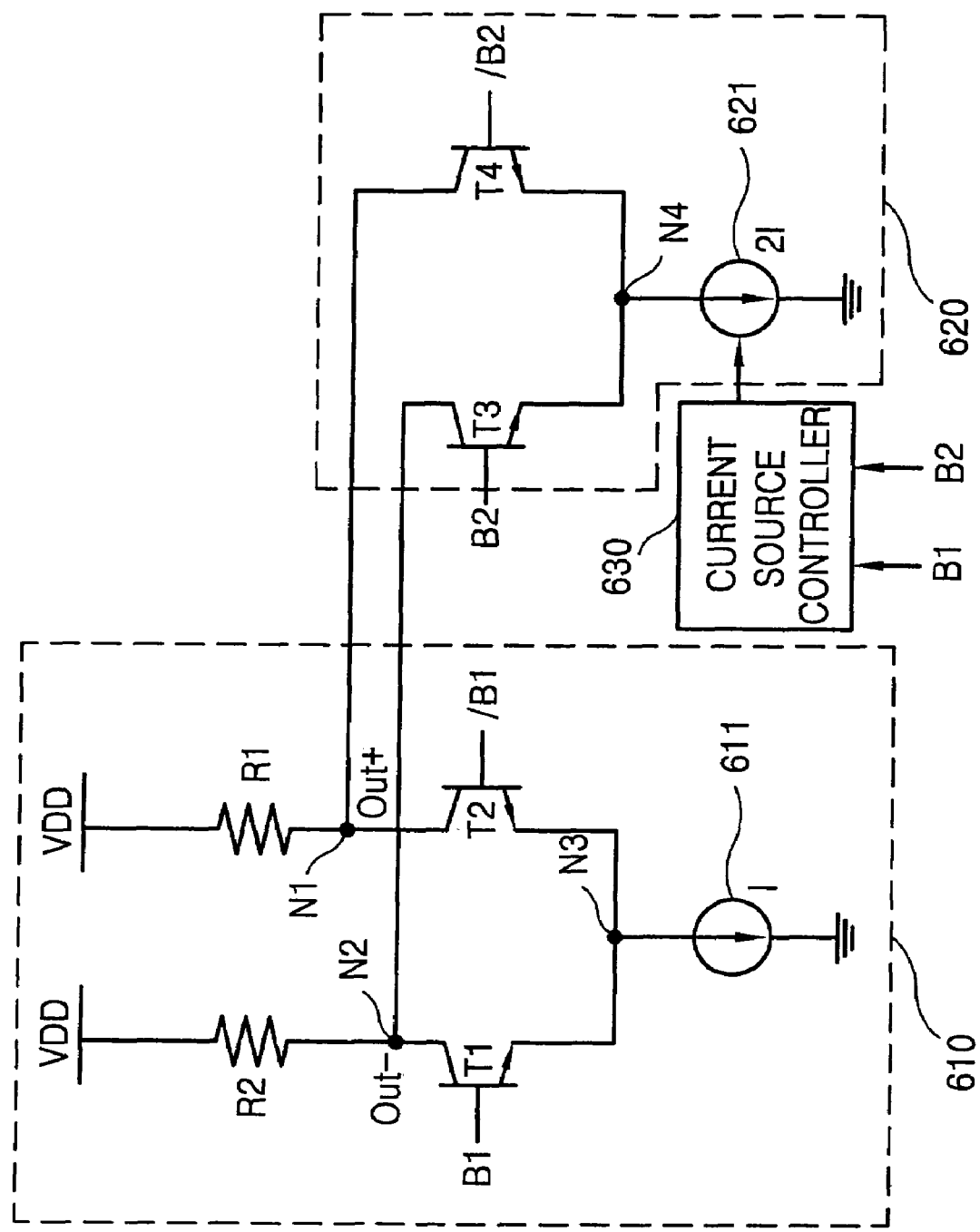
FIG. 6 is a circuit diagram illustrating a low-power 4-PAM driver according to an exemplary embodiment of the present invention.

FIG. 6 is a circuit diagram illustrating a 4-PAM driver according to an exemplary embodiment of the present invention. Referring to FIG. 6, like the 4-PAM driver of FIG. 4, the 4-PAM driver includes a first-stage circuit 610, a second-stage circuit 620, and a current source controller 630.

The first-stage circuit 610 and the second-stage circuit 620 are the same as those of the first-stage circuit 410 and the second-stage circuit 420 of FIG. 4, except that input transistors T1 through T4 of FIG. 6 are embodied as bipolar junction transistors (BJTs) and the input transistors T1 through T4 of FIG. 4 are embodied as CMOS transistors.

The operation of the current source controller 630 is the same as that of the current source controller 430 of FIG. 4 in that it turns on or off a second current source 621 in response to first and second bit signals B1 and B2. However, the circuit of the current source controller 630 may be different from that of the current source controller 430.

The 4-PAM driver shown in FIG. 6 is operated in a manner similar to that of the 4-PAM driver illustrated in FIG. 4, and thus, a detailed description thereof is not required.

Exemplary embodiments of the present invention have been described with respect to a 4-PAM driver, but the present invention is applicable to any M-level PAM driver where M is greater than 3, such as an 8-PAM driver or a 16-PAM driver.

For instance, an 8-PAM driver according to the present invention may be embodied by adding a pair of input transistors (not shown) that receive 3-bit signals and a third current source (not shown) to the 4-PAM driver illustrated in FIG. 6. In the 8-PAM driver embodiment of the invention, second and third current sources may be selectively activated or deactivated by a current source controller.

Since an M-level PAM driver according to an exemplary embodiment of the present invention transforms at least two bit signals into an M-level PAM signal and outputs the M-level PAM signal, the M-level PAM driver can be used in a data transceiver (M>3). The M-level PAM driver can be used to exchange data between semiconductor chips.

Figure 7:
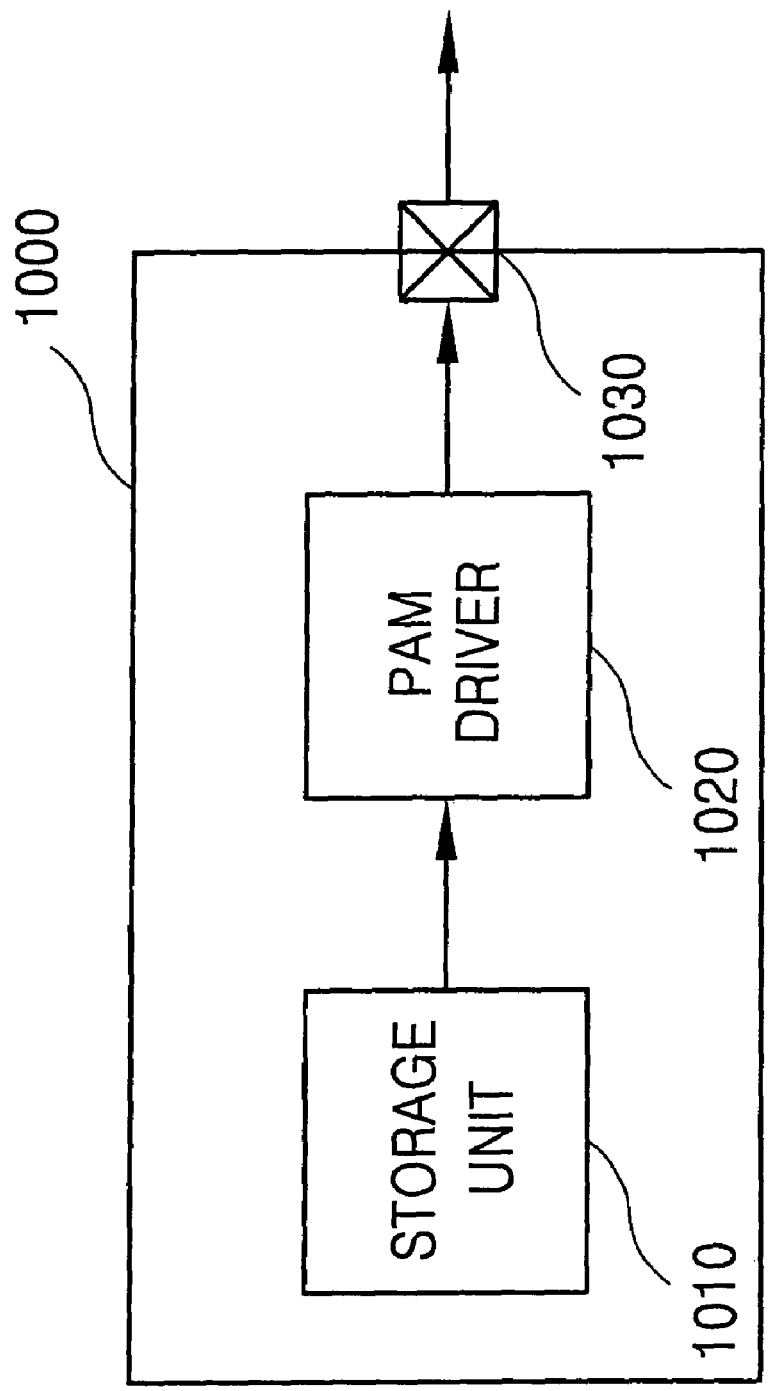
FIG. 7 is a schematic block diagram illustrating a multi-level PAM driver according to an exemplary embodiment of the present invention.

FIG. 7 is a schematic block diagram illustrating a semiconductor device 1000 with a multi-level PAM driver according to an exemplary embodiment of the present invention. Referring to FIG. 7, the semiconductor device 1000 includes a storage unit 1010, a PAM driver 1020, and a pad 1030.

In the semiconductor device 1000, a binary bit signal is stored in the storage unit 1010. The binary bit signal is transformed into a multi-level PAM signal by the PAM driver 1020 and the multi-level PAM signal is output via the pad 1030, thereby transmitting the binary bit signal outside the semiconductor device 1000. FIG. 7 illustrates the PAM driver 1020 and the pad 1030 each as single blocks for convenience of explanation, but a plurality of PAM drivers and a plurality of pads may be included in the semiconductor device 1000.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An M-level pulse amplitude modulation (PAM) driver comprising:
  a load unit electrically connected to an output terminal;
  a first current source supplying a first amount of current to the load unit;
  a second current source supplying a second amount of current to the load unit;
  a pair of first input transistors electrically connecting the first current source and the load unit in response to a first bit signal;

a pair of second input transistors electrically connecting the second current source and the load unit in response to a second bit signal; and a current source controller that activates or deactivates one of the first and second current sources in response to the first and second bit signals, wherein M is an integer greater than 3.

2. The M-level PAM driver of claim 1, wherein the current source controller activates the second current source when the first and second bit signals are at the same logic level, and deactivates the second current source when the first and second bit signals are at different logic levels.

3. The M-level PAM driver of claim 2, wherein the load unit comprises:

a first resistor electrically connected to a positive output terminal; and a second resistor electrically connected to a negative output terminal;

wherein the pair of first input transistors comprise a first input transistor and a second input transistor, wherein a first terminal of the first input transistor is connected to a first terminal of the second input transistor, wherein a second terminal of the first input transistor is connected to the negative output terminal, wherein a second terminal of the second input transistor is connected to the positive output terminal, wherein a third terminal of the first input transistor and a third terminal of the second input transistor receive a signal based on the first bit signal;

wherein the pair of second input transistors comprise a third input transistor and a fourth input transistor, wherein a first terminal of the third input transistor is connected to a first terminal of the fourth input transistor; wherein a second terminal of the third input transistor is connected to the negative output terminal; wherein a second terminal of the fourth transistor is connected to the positive output terminal; and wherein a third terminal of the third input transistor and a third terminal of the fourth input transistor receive a signal based on the second bit signal.

4. The M-level PAM driver of claim 3, wherein the pair of first input transistors selectively connects the first current source to one of the first and second resistors in response to the first bit signal, and wherein the pair of second input transistors selectively connects the second current source to one of the first and second resistors in response to the second bit signal.

5. The M-level PAM driver of claim 4, wherein the second current source is deactivated for at least M/2 levels of M possible levels of a differential output voltage signal, wherein the differential output voltage signal is a voltage signal difference between the positive output terminal and the negative output terminal.

6. An M-level pulse amplitude modulation (PAM) driver comprising:

a load unit;

a differential output terminal outputting a differential output voltage signal based on an amount of current flowing through the load unit;

an input unit receiving a plurality of bit signals;

a plurality of current sources respectively supplying different amounts of current to the load unit;

a current source controller activating or deactivating selected ones of the plurality of current sources in response to the plurality of bit signals, wherein M is an integer greater than 3.

7. The M-level PAM driver of claim 6, wherein the plurality of current sources comprises:

a first current source supplying a first amount of current to the load unit; and a second current source supplying a second amount of current to the load unit;

wherein the input unit comprises:

a pair of first input transistors receiving a first bit signal; and a pair of second input transistors receiving a second bit signal; and wherein M is 4.

8. The M-level PAM driver of claim 7, wherein the current source controller activates the second current source when the first and second bit signals are at the same logic level, and wherein the current source controller deactivates the second current source when the first and second bit signals are at different logic levels.

9. The M-level PAM driver of claim 8, wherein the first current source comprises a first transistor; wherein a width and length of the first transistor are in a predetermined ratio;

wherein the second current source comprises a second transistor; and wherein a ratio of a width and length of the second transistor is a predetermined multiple of the predetermined ratio.

10. The M-level PAM driver of claim 9, wherein the current source controller applies a first voltage to the second transistor to activate the second transistor when the first and second bit signals are at the same logic level, and applies a second voltage to the second transistor to deactivate the second transistor when the first and second bit signals are at different logic levels.

11. A semiconductor device comprising:

a storage unit to store a first bit signal and a second bit signal; and an M-level pulse amplitude modulation (PAM) driver transforming the first bit signal and the second bit signal into an M-level PAM signal and outputting the M-level PAM signal, where M is an integer greater than 3, wherein the M-level PAM driver comprises:

a load unit electrically connected to an output terminal;

a first current source supplying a first amount of current to the load unit;

a second current source supplying a second amount of current to the load unit;

a pair of first input transistors electrically connecting the first current source and the load unit in response to the first bit signal;

a pair of second input transistors electrically connecting the first current source and the load unit in response to the second bit signal; and a current source controller activating or deactivating the first and second current sources in response to the first and second bit signals.

12. The semiconductor device of claim 11, wherein the current source controller activates the second current source when the first and second bit signals are at the same logic level, and deactivates the second current source when the first and second bit signals are at different logic levels.

13. The semiconductor device of claim 12, wherein the load unit comprises:

a first resistor electrically connected to a positive output terminal; and a second resistor electrically connected to a negative output terminal;

wherein the pair of first input transistors comprise a first input transistor and a second input transistor, wherein a first terminal of the first input transistor is connected to a first terminal of the second input transistor; wherein a second terminal of the first input transistor is connected to the negative output terminal; wherein a second terminal of the second input transistor is connected to a positive output terminal; wherein a third terminal of the first input transistor and a third terminal of the second input transistor receive a signal based on the first bit signal;

wherein the pair of second input transistors comprise a third input transistor and a fourth input transistor, wherein a first terminal of the third input transistor is connected to a first terminal of the fourth input transistor; wherein a second terminal of the third input transistor is connected to the negative output terminal; wherein a second terminal of the fourth input transistor is connected to the positive output terminal; and wherein a third terminal of the third input transistor and a third terminal of the fourth input transistor receive a signal based on the second bit signal.

* * * * *